(12) United States Patent
Kobayashi et al.

(10) Patent No.: US 10,453,600 B2
(45) Date of Patent: Oct. 22, 2019

(54) DIFFERENTIAL MODE FILTER

(71) Applicant: TDK Corporation, Tokyo (JP)

(72) Inventors: Tsutomu Kobayashi, Tokyo (JP); Toshio Tomonari, Tokyo (JP); Emi Ito, Yamagata (JP); Yuma Koyama, Tokyo (JP)

(73) Assignee: TDK CORPORATION, Tokyo (JP)

( * ) Notice: Subject to any disclaimer, the term of this patent is extended or adjusted under 35 U.S.C. 154(b) by 215 days.

(21) Appl. No.: 15/483,099

(22) Filed: Apr. 10, 2017

(65) Prior Publication Data
US 2017/0301455 A1    Oct. 19, 2017

(30) Foreign Application Priority Data

Apr. 19, 2016 (JP) .................. 2016-083309

(51) Int. Cl.
H01F 27/28 (2006.01)
H01F 27/24 (2006.01)
H03H 1/00 (2006.01)
H01F 17/04 (2006.01)
H01F 19/04 (2006.01)

(52) U.S. Cl.
CPC ....... H01F 27/2823 (2013.01); H01F 17/045 (2013.01); H01F 19/04 (2013.01); H01F 27/24 (2013.01); H03H 1/00 (2013.01); H01F 2027/2838 (2013.01); H03H 2001/005 (2013.01); H03H 2001/0092 (2013.01)

(58) Field of Classification Search
CPC .............................. H01F 27/2823; H01F 27/24
USPC ..................... 336/83, 90, 192, 229
See application file for complete search history.

(56) References Cited

U.S. PATENT DOCUMENTS

2009/0295525 A1* 12/2009 Okawa .................. H01F 27/006
                                                            336/192
2014/0167903 A1*  6/2014 Tomonari ............. H01F 17/045
                                                            336/220
2017/0025212 A1*  1/2017 Jerez ..................... H01F 17/045

FOREIGN PATENT DOCUMENTS

JP    2007-036158 A       2/2007
JP    2008034777 A   *    2/2008
JP    2010-165953 A       7/2010
JP    2010165953 A   *    7/2010

* cited by examiner

Primary Examiner — Tszfung J Chan
(74) Attorney, Agent, or Firm — Young Law Firm, P.C.

(57) ABSTRACT

Disclosed herein is a differential mode filter including a core including a winding core part, a first wire wound around the winding core part in a first winding direction, and a second wire wound around the winding core part in a second winding direction opposite to the first winding direction. The winding core part includes first and second winding surfaces. A first crossing angle between the first and second wires that cross a plurality of times on the first winding surface is smaller than that a second crossing angle between the first and second wires that cross a plurality of times on the second winding surface.

20 Claims, 11 Drawing Sheets

DIFFERENTIAL MODE FILTER

BACKGROUND OF THE INVENTION

Field of the Invention

The present invention relates to a differential mode filter and, more particularly to a differential mode filter excellent in high-frequency characteristics.

Description of Related Art

A differential mode filter is used as a device passing a common mode component on a differential signal line therethrough while blocking a differential mode component (see Japanese Patent Application Laid-open Nos. 2007-036158 and 2010-165953).

As described in Japanese Patent Application Laid-open Nos. 2007-036158 and 2010-165953, in the differential mode filter, a pair of wires are wound in opposite directions, so that they cross each other a plurality of times on a winding core. This is a structural feature of the differential mode filter.

As described above, in the differential mode filter, a pair of wires need to be wound so as to cross each other, making it more difficult to wind the wire than in the common mode filter. Thus, the wire winding position may be unstable, which may lead to an increase in variation in high-frequency characteristics because of variation in the winding position.

SUMMARY

It is therefore an object of the present invention to enhance high-frequency characteristics of a differential mode filter by suppressing variation in the winding position.

A differential mode filter according to one aspect of the present invention includes a core having a winding core part, a first wire wound around the winding core part in a first winding direction, and a second wire wound around the winding core part in a second winding direction opposite to the first winding direction. The winding core part includes first and second winding surfaces. The crossing angle between the first and second wires that cross a plurality of times on the first winding surface is smaller than that between the first and second wires on the second winding surface.

According to the present invention, the distance between the first and second wires in the axial direction of the winding core part on the first winding surface is small, thereby making it easy to wind one wire based on the other wire. This suppresses variation in the winding position, allowing high-frequency characteristics to be enhanced.

In this case, on the first winding surface, the first and second wires preferably contact each other in the axial direction. With this configuration, variation in the winding position is further suppressed, allowing high-frequency characteristics to be further enhanced.

In the present invention, the winding core part preferably has a substantially quadrangular shape in cross section perpendicular to the axial direction. With this configuration, the winding core part has corner portions, so that the wire position can be stabilized.

The differential mode filter according to the present invention further includes first and third terminal electrodes connected respectively to one and the other ends of the first wire and second and fourth terminal electrodes connected respectively to one and the other ends of the second wire. The core further includes a first flange part provided at one end of the winding core part in the axial direction and a second flange part provided at the other end of the winding core part in the axial direction. The first and second terminal electrodes are provided on the first flange part, and the third and fourth terminal electrodes are provided on the second flange part. With the above configuration, there can be provided a surface-mount type differential mode filter using a drum core.

A differential mode filter according to another aspect of the present invention includes a core having a winding core part, a first wire wound around the winding core part in a first winding direction, and a second wire wound around the winding core part in a second winding direction opposite to the first winding direction. The winding core part includes a first winding surface on which the first and second wires cross each other. The first winding surface has a first region in which the first and second wires are positioned on the first flange part side and the second flange part side, respectively, and a second region in which the first and second wires are positioned on the second flange part side and the first flange part side, respectively. The first and second wires contact each other in at least one of the first and second regions.

According to the present invention, one wire is wound based on the other one thereof, making it easy to wind the one wire. Thus, variation in the winding position is suppressed, thus allowing high-frequency characteristics to be enhanced.

In this case, the first and second wires preferably contact each other in both the first and second regions. This further suppresses variation in the winding position, thus allowing high-frequency characteristics to be further enhanced.

As described above, according to the present invention, there can be provided a differential mode filter having enhanced high-frequency characteristics.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
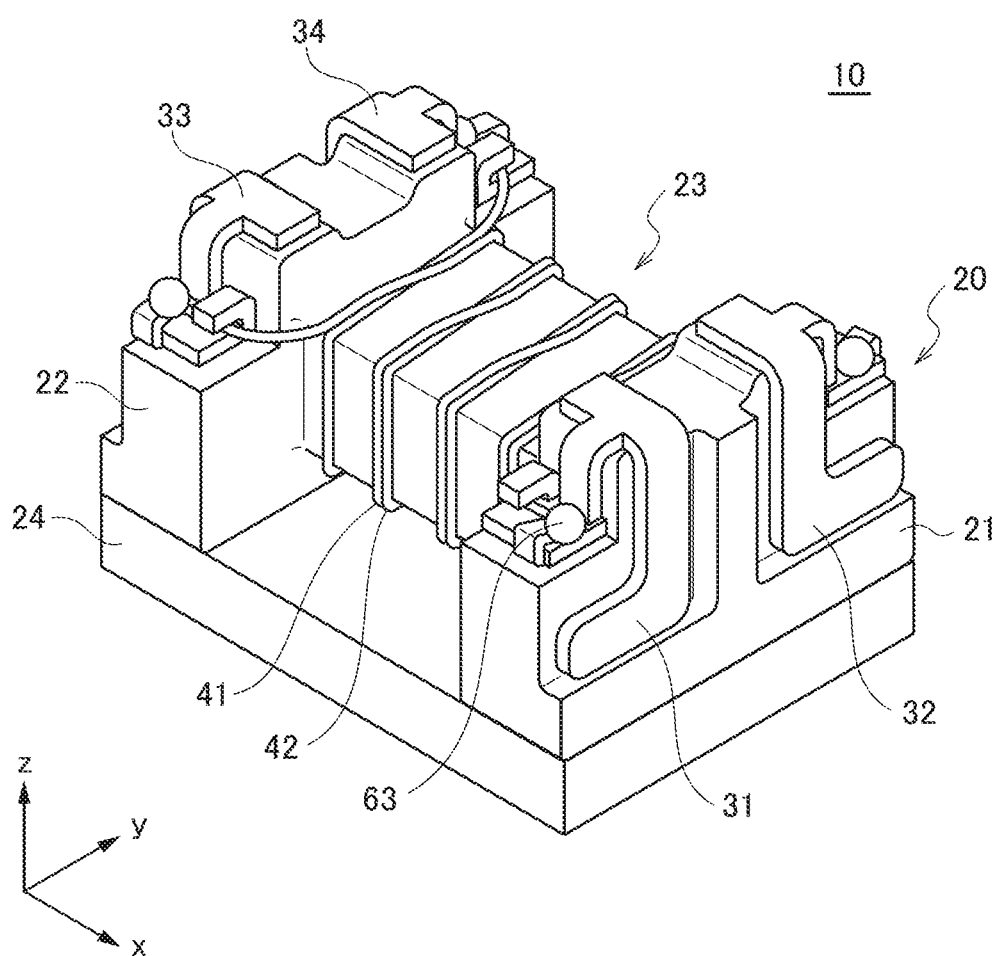
FIG. 1 is a schematic perspective view illustrating an outer appearance of a differential mode filter according to a preferred embodiment of the present invention.

FIG. 1 is a schematic perspective view illustrating the outer appearance of the differential mode filter 10 according to a preferred embodiment of the present invention.

Figure 2:
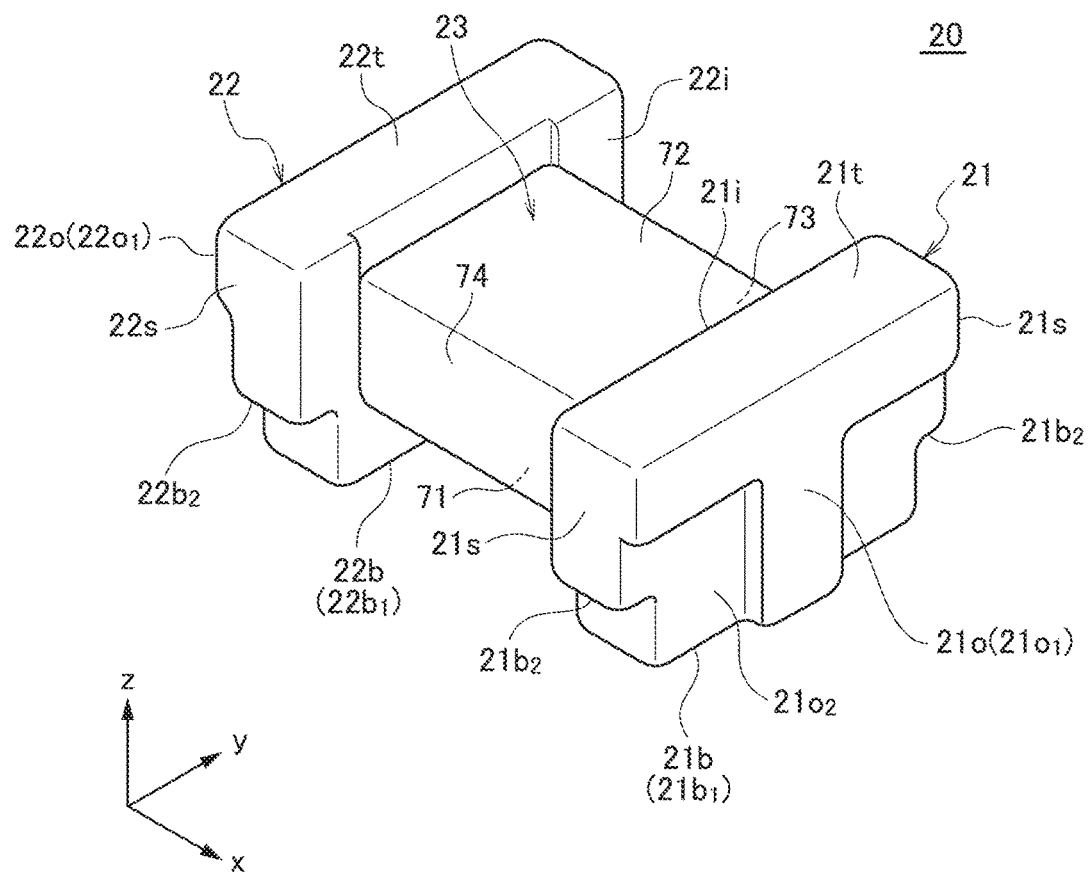
FIG. 2 is a schematic perspective view illustrating a core shown in FIG. 1.
Figure 3:
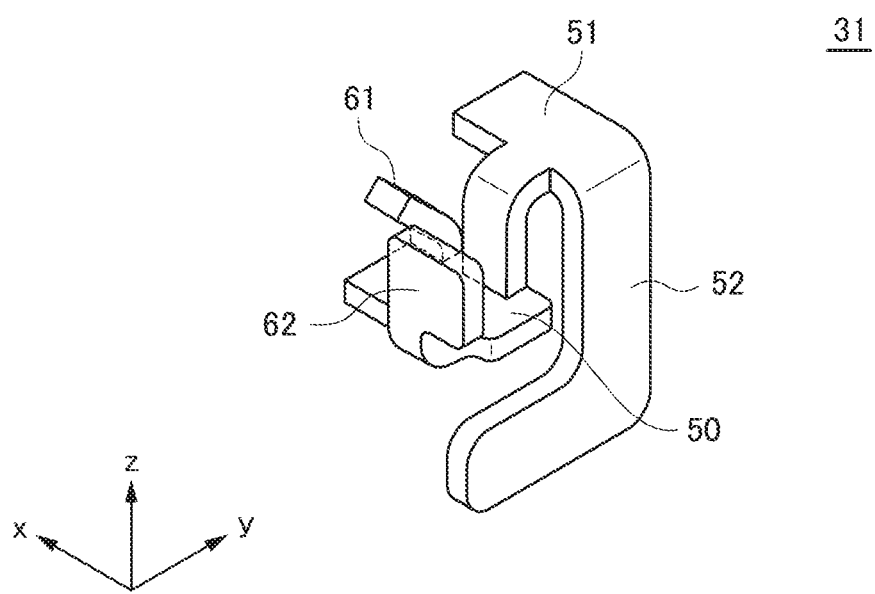
FIG. 3 is a schematic perspective view illustrating a terminal electrode shown in FIG. 1.

As illustrated in FIG. 1, the differential mode filter 10 according to the present embodiment includes a drum core 20, a plate core 24, first to fourth terminal electrodes 31 to 34, and first and second wires 41 and 42 wound in opposite directions to each other. The structure of the core 20 is illustrated in FIG. 2, and the structure of the first terminal electrode 31 is illustrated in FIG. 3. The cores 20 and 24 are each formed of a magnetic material having a comparatively high permeability, such as an Ni—Zn based ferrite. The first to fourth terminal electrodes 31 to 34 are each a metal fitting formed of a good conductor material such as copper.

The core 20 has a first flange part 21, a second flange part 22, and a winding core part 23 disposed between the first and second flange parts 21 and 22. The winding core part 23 has its axis direction in the x-direction. The first and second flange parts 21 and 22 are disposed at both ends of the winding core part 23 in the axial direction and integrally formed with the winding core part 23. The first flange part 21 has an inner side surface 21$i$ connected to the winding core part 23, an outer side surface 21$o$ positioned on the side opposite the inner side surface 21$i$, a top surface 21$t$ to which the plate core 24 is bonded, a bottom surface 21$b$ positioned on the side opposite the top surface 21$t$, and side surfaces 21$s$ positioned on sides opposite each other. The inner side surface 21$i$ and outer side surface 21$o$ each constitute the yz plane, the top surface 21$t$ and bottom surface 21$b$ each constitute the xy plane, and the side surfaces 21$s$ each constitute the xz plane. Similarly, the second flange part 22 has an inner side surface 22$i$ and an outer side surface 22$o$ each constituting the yz plane, a top surface 22$t$ and a bottom surface 22$b$ each constitute the xy plane, and two side surfaces 22$s$ each constitute the xz plane.

As illustrated in FIG. 2, the bottom surfaces 21$b$, 22$b$ and outer side surfaces 21$o$, 22$o$ each have a step. Specifically, the bottom surface 21$b$ has an upper stage surface 21$b_1$ and a lower stage surface 21$b_2$, the bottom surface 22$b$ has an upper stage surface 22$b_1$ and a lower stage surface 22$b_2$, the outer side surface 21$o$ has an upper stage surface 21$o_1$ and a lower stage surface 21$o_2$, and the outer side surface 22$o$ has an upper stage surface 22$o_1$ and a lower stage surface 22$o_2$. The first and second terminal electrodes 31 and 32 are disposed so as to cover the upper stage surface 21$b_1$, lower stage surface 21$b_2$ and lower stage surface 21$o_2$ of the first flange part 21. The third and fourth terminal electrodes 33 and 34 are disposed so as to cover the upper stage surface 22$b_1$, lower stage surface 22$b_2$, and lower stage surface 22$o_2$ of the second flange part 22. Fixing of the first to fourth terminal electrodes 31 to 34 is made by using an adhesive or the like.

As illustrated in FIG. 3, the first terminal electrode 31 has a wire connection part 50, a first connection part 51, and a second connection part 52. The wire connection part 50 is a part that covers the lower stage surface 21$b_2$ of the bottom surface 21$b$ and is connected with one end of the first wire 41. As illustrated in FIG. 3 which illustrates a state before wire connection, the wire connection part 50 has a fixing piece 61 for holding one end of the first wire 41 and a welding piece 62 for welding the one end of the first wire 41 thereto. Specifically, the wire connection is made as follows. That is, in a state where the fixing piece 61 is folded to hold the one end of the first wire 41, the welding piece 62 is folded to hold the one end of the first wire 41 between the wire connection part 50 and the welding piece 62, and then laser beam is irradiated to melt the welding piece 62, to thereby weld the one end of the first wire 41 to the wire connection part 50. After the welding, a weld ball 63 illustrated in FIG. 1 is formed, whereby the one end of the first wire 41 and the wire connection part 50 are firmly fixed.

The first connection part 51 is a part that covers the upper stage surface 21$b_1$ of the bottom surface 21$b$ and faces a land pattern on a printed circuit board at mounting. The second connection part 52 is a part that covers the lower stage surface 21$o_2$ of the outer side surface 21$o$ and is a part at which a solder fillet is formed at mounting. In the present embodiment, the second connection part 52 has a shape folded in an L-shape, whereby the mounting strength is enhanced.

Other terminal electrodes 32 to 34 have the same structure. The one and the other ends of the first wire 41 are connected to the first and third terminal electrodes 31 and 33, respectively, and one and the other ends of the second wire 42 are connected to the second and fourth terminal electrodes 32 and 34, respectively. As a result, there is formed a differential mode filter circuit in which, for example, a pair of the first and second terminal electrodes 31 and 32 serve as an input side and a pair of the third and fourth terminal electrodes 33 and 34 serve as an output side. However, the differential mode filter 10 according to the present embodiment has no directivity, so that it is possible to use the pair of third and fourth terminal electrodes 33 and 34 as the input side and the pair of the first and second terminal electrodes 31 and 32 as the output side. Further, the terminal electrodes 31 to 34 each have the structure illustrated in FIG. 3, so that firm connection to the corresponding wires 41 and 42 can be made. In addition, the weld ball 63 is formed in the lower stage surfaces 21$b_2$ and 22$b_2$ of the bottom surfaces 21$b$ and 22$b$, so that it is possible to prevent unstable mounting which may be caused due to interference between the weld ball 63 and the printed board.

Figure 4:
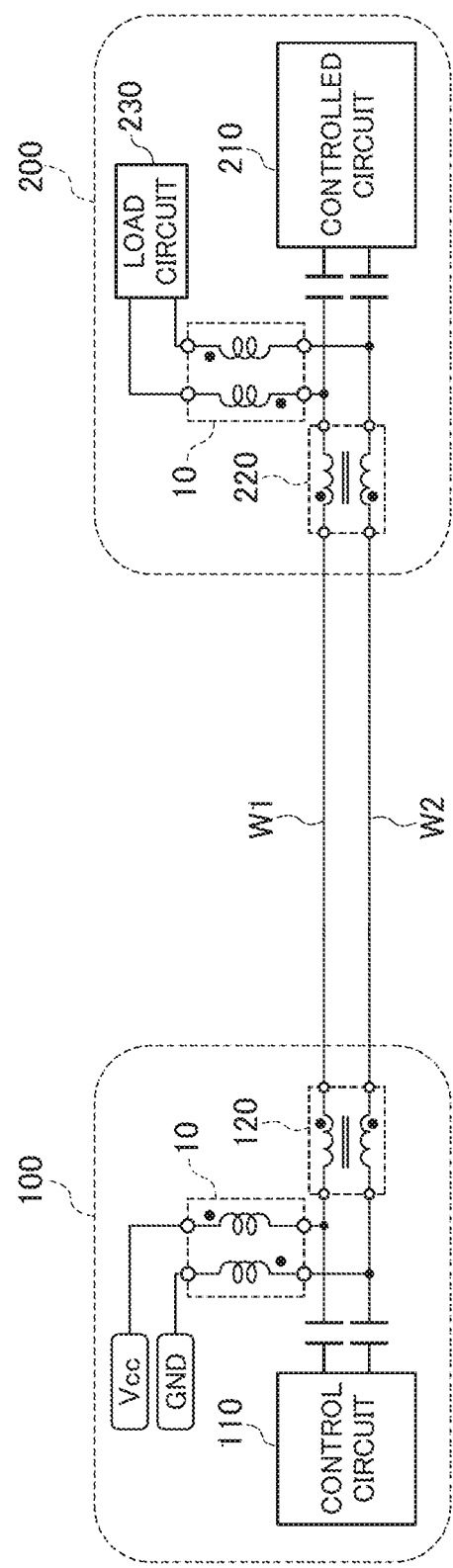
FIG. 4 is a circuit diagram for explaining an example of use of the differential mode filter shown in FIG. 1.

FIG. 4 is a circuit diagram for explaining an example of use of the differential mode filter 10 according to the present embodiment.

In the example of FIG. 4, a control device 100 and a controlled device 200 are connected to each other through a pair of differential signal lines W1 and W2. The control device 100 includes a control circuit 110 that outputs a differential signal to the differential signal lines W1 and W2 and a common mode filter 120 that removes common mode noise superimposed on the differential signal lines W1 and W2. The controlled device 200 includes a controlled circuit 210 that receives the differential signal transmitted through the differential signal lines W1 and W2 and a common mode filter 220 that removes common mode noise superimposed on the differential signal lines W1 and W2. With this configuration, the differential signal can be supplied from the control circuit 110 to controlled circuit 210.

In the control device 100, a power supply potential Vcc is applied to the differential signal line W1, and a ground potential GND is applied to the differential signal line W2. As a result, the pair of differential signal lines W1 and W2 also function as power supply wirings, whereby power can be supplied to a load circuit 230 included in the controlled device 200.

In such a circuit configuration, the differential mode filter 10 can be applied to the control device 100 and controlled device 200. That is, in the control device 100, the differential mode filter 10 is inserted between the pair of differential signal lines W1 and W2 and a pair of power supply Vcc and GND wire ends, while in the controlled device 200, the differential mode filter 10 is inserted between the pair of differential signal lines W1 and W2 and the load circuit 230. This makes it possible to prevent the differential signal from flowing in the power supply Vcc, GND, and load circuit 230 to thereby allow passage of only a DC voltage component.

Figure 5:
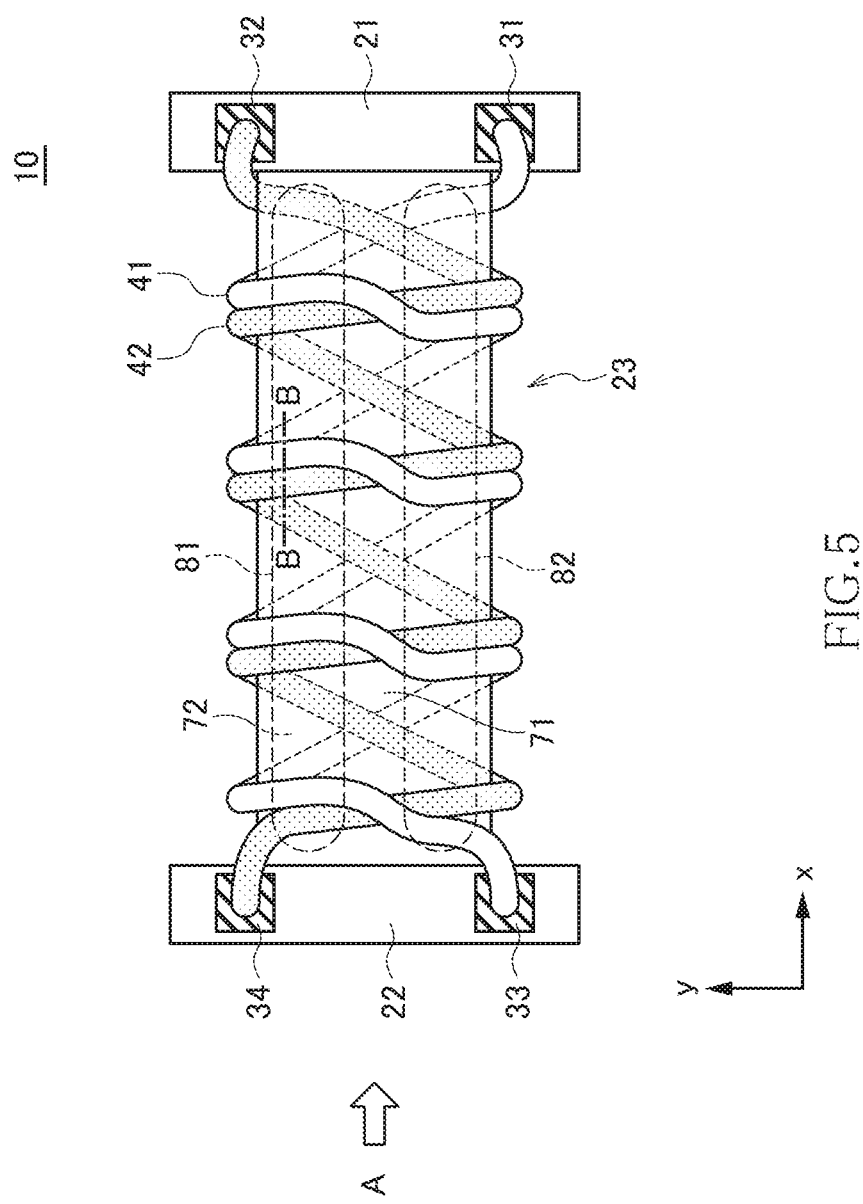
FIGS. 5 and 6 are views explaining a winding layout of the first and second wires.
Figure 6:
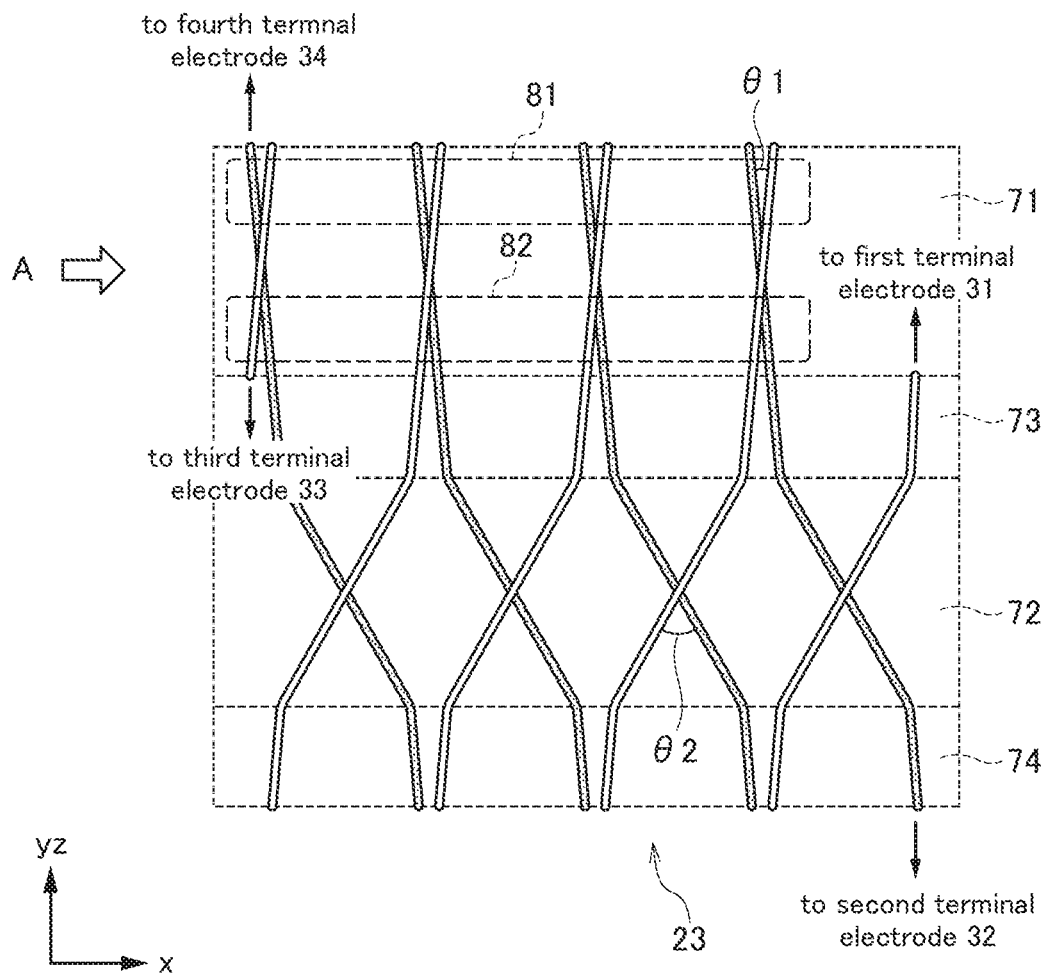

FIGS. 5 and 6 are views explaining the winding layout of the first and second wires 41 and 42. FIG. 5 is a schematic view, and FIG. 6 is a developed view.

As illustrated in FIGS. 5 and 6, when viewed in the direction of the arrow A, the first wire 41 is wound right handed (clockwise) from the first terminal electrode 31 to third terminal electrode 33, while the second wire 42 is wound left handed (counterclockwise) from the second terminal electrode 32 to the fourth terminal electrode 34. It follows that the first and second wires 41 and 42 cross each other a plurality of times on the winding core part 23.

More specifically, the winding core part 23 has a substantially quadrangular shape in cross section (yx cross section) perpendicular to the axial direction thereof and thus has four winding surfaces 71 to 74 extending in the axial direction. The substantially quadrangular shape in this embodiment does not necessarily refer to a perfect quadrangle. For example, the corners of the quadrangle may be rounded, or the sides constituting the quadrangle may be curved in a convex manner.

The first winding surface 71 constitutes the xy plane and positioned on the side opposite the plate core 24. As illustrated in FIGS. 5 and 6, on the first winding surface 71, the first and second wires 41 and 42 cross each other a plurality of times (four times in the present embodiment). Although not particularly limited, in the present embodiment, the first wire 41 and second wire 42 cross each other on the first winding surface 71 in such a way that the first wire 41 overlies the second wire 42. The crossing angle between the first and second wires 41 and 42 on the first winding surface 71 is $\theta 1$.

The second winding surface 72 constitutes the xy plane and faces the plate core 24. As illustrated in FIGS. 5 and 6, on the second winding surface 72 as well, the first and second wires 41 and 42 cross each other a plurality of times (four times in the present embodiment). Although not particularly limited, in the present embodiment, the first wire 41 and second wire 42 cross each other on the second winding surface 72 in such a way that the first wire 41 overlies the second wire 42. The crossing angle between the first and second wires 41 and 42 on the second winding surface 72 is $\theta 2$ ($>\theta 1$).

That is, the crossing angle $\theta 1$ on the first winding surface 71 is smaller than the crossing angle $\theta 2$ on the second winding surface 72, and thus, the first and second wires 41 and 42 show a higher degree of parallelism on the first winding surface 71 than on the second winding surface 72. As a result, a section in which the first and second wires contact each other is longer on the first winding surface 71 than on the second winding surface 72. Particularly, in the present embodiment, the first and second wires 41 and 42 contact each other in the axial direction (x-direction) on the first winding surface 71, while they do not cross each other in the axial direction (x-direction) on the second winding surface 72.

Specifically, as illustrated in FIGS. 5 and 6, when a half of the first winding surface 71 in the y-direction is defined as a first region 81, and the other half thereof is as a second region 82, the positional relationship between the first and second wires 41 and 42 in the first region 81 and that between the first and second wires 41 and 42 in the second region 82 are opposite each other. That is, in the first region 81, the first and second wires 40 and 41 are positioned on the first flange part 21 side and the second flange part 22 side, respectively; while in the second region 82, the first and second wires 40 and 41 are positioned on the second flange part 22 side and the first flange part 21 side, respectively.

Figure 7:
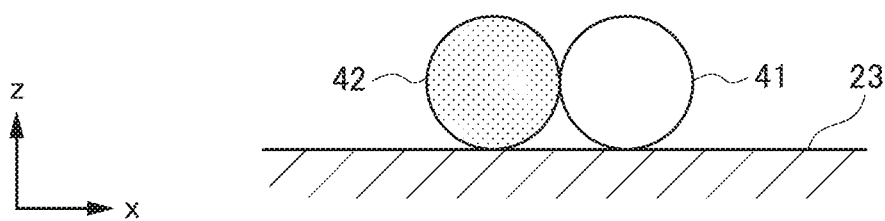
FIG. 7 is a cross-sectional view taken along line B-B in FIG. 5.

Further, in the present embodiment, the first and second wires 41 and 42 contact each other in the axial direction both in the first and second regions 81 and 82. That is, as illustrated in FIG. 7 which is a cross-sectional view taken along line B-B in FIG. 5, before and after the first and second wires 41 and 42 cross each other, there is a section where both of them contact the first winding surface 71 and run along each other. As illustrated in FIG. 5, to make the first and second wires 41 and 42 contact in the axial direction, the wire on the upper side (first wire 41) is slightly bent downward (to the second wire 42 side) before and after the first and second wires 41 and 42 cross each other to make them run along each other.

This makes it easy to wind one wire based on the other wire, thereby suppressing variation in the winding position. The first and second wires 41 and 42 may be made to contact each other in only one of the first and second regions 81 and 82; however, variation in the winding position can be suppressed more reliably when they are made to contact each other in both the first and second regions 81 and 82.

On the other hand, on the second winding surface 72, the first and second wires 41 and 42 contact each other only at a portion where they cross each other. That is, on the second winding surface 72, the first and second wires 41 and 42 do not contact each other in the axial direction. Thus, since the crossing angle $\theta 2$ is large on the second winding surface 72, both the first and second wires 41 and 42 can ensure a large transition amount in the x-direction.

The third and fourth winding surfaces 73 and 74 each constitute the xy plane. On the third and fourth winding surfaces 73 and 74, the first and second wires 41 and 42 do not cross each other. In the present embodiment, the first and second winding surfaces 71 and 72 have a wider area than the third and fourth winding surfaces 73 and 74, so that a sufficient contact distance between the first and second wires 41 and 42 can be ensured on the first winding surface 71. A corner portion serving as a boundary between the first or second winding surface 71 or 72 and the third or fourth winding surface 73 or 74 plays a role of fixing the positions of the first and second wires 41 and 42. That is, when the winding core part is formed into a substantially quadrangular shape in cross section, displacement of the first and second wires 41 and 42 after the winding can be prevented more reliably than when the winding core part is formed into a circular or ellipsoidal shape in cross section.

As described above, in the differential mode filter 10 according to the present embodiment, by making the crossing angle $\theta 1$ between the first and second wires 41 and 42 small on the first winding surface 71, the first and second wires 41 and 42 are made to contact each other in the axial direction on the first winding surface 71. This facilitates the winding of one wire based on the other wire, suppressing variation in the winding position, thus enabling high-frequency characteristics to be enhanced.

The first and second wires 41 and 42 cross each other a plurality of times on the first and second winding surfaces 71 and 72, so that there are the plurality of crossing angles θ1 and θ2. The plurality of crossing angles θ1 or the plurality of crossing angles θ2 are preferably substantially constant; actually, however, some variation will unavoidably occur. Even when some variation occurs, the above effect can be obtained by making each of the plurality of crossing angles θ1 smaller than the plurality of crossing angles θ2.

Figure 8:
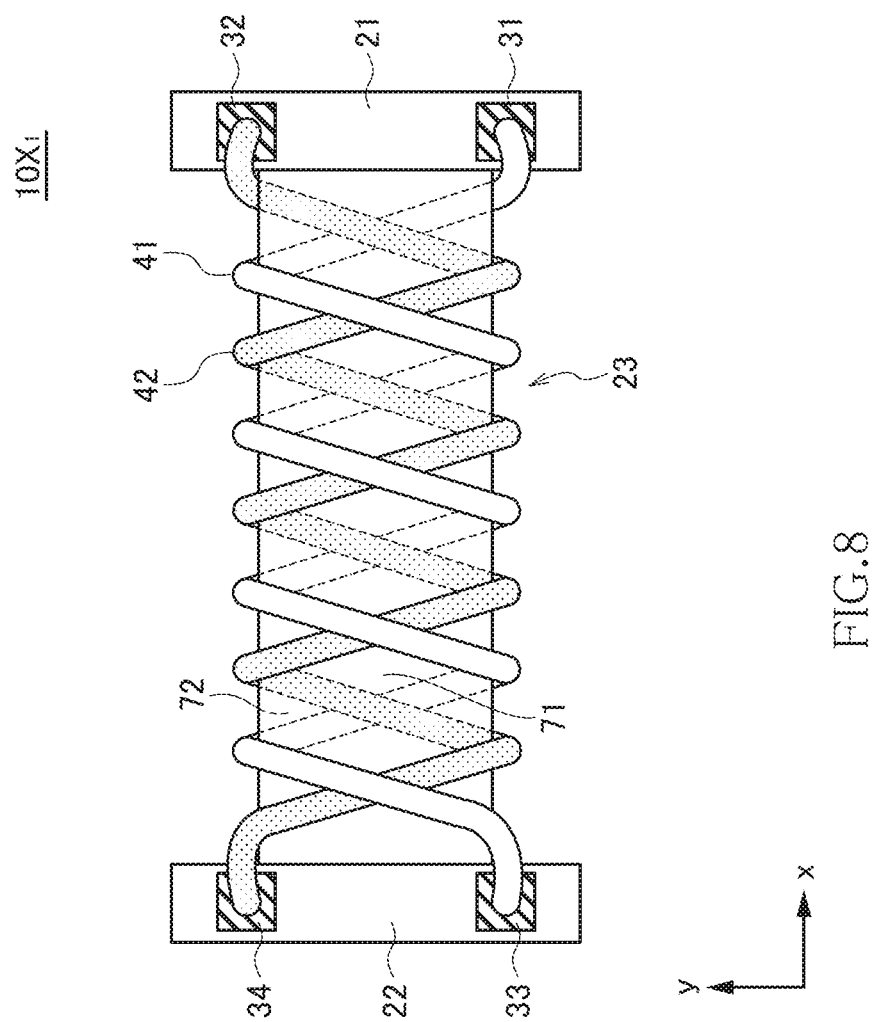
FIGS. 8 and 9 are schematic views for explaining a winding layout in a differential mode filter according to a reference example.

FIG. 8 is a schematic view for explaining the winding layout in a differential mode filter 10X$_1$ according to a reference example.

Figure 9:
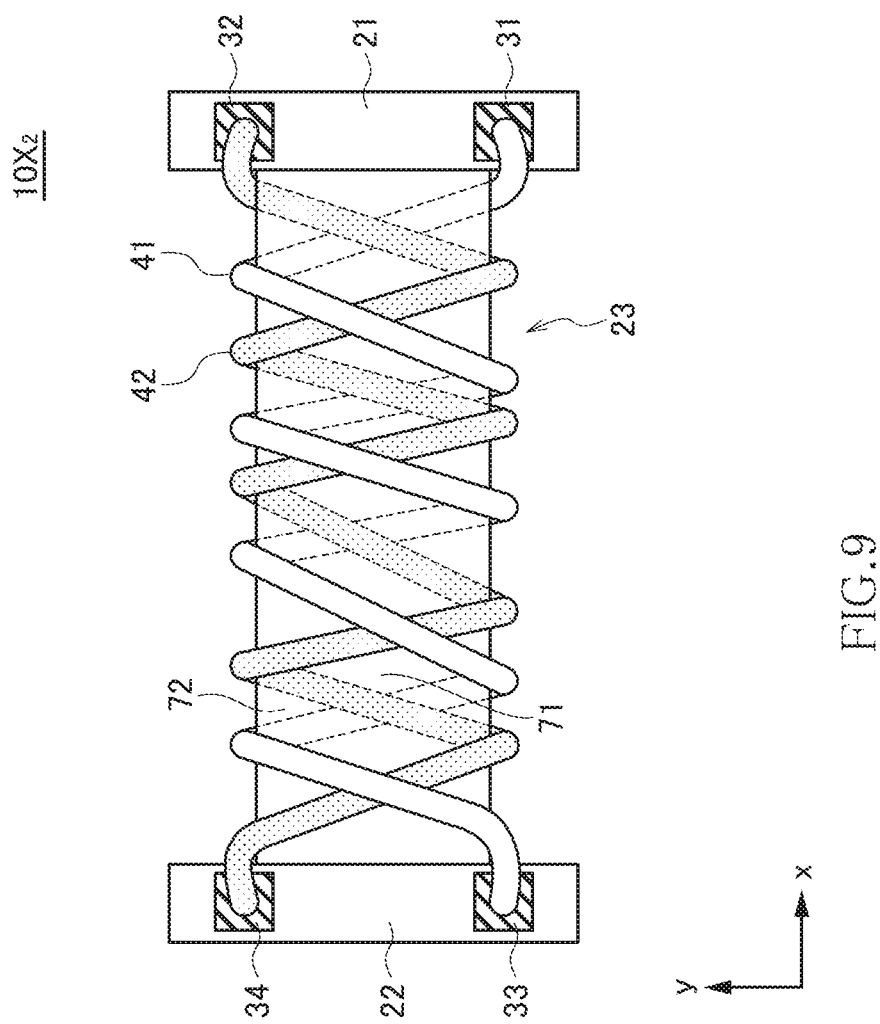

In the reference example of FIG. 8, the crossing angle between the first and second wires 41 and 42 on the first winding surface 71 and that between the first and second wires 41 and 42 on the second winding surface 72 are the same. That is, the first and second wires 41 and 42 are substantially uniformly wound around the winding core part 23. Even with such a winding method, desired high-frequency characteristics can be obtained by exactly uniformly winding the first and second wires 41 and 42 around the winding core part 23. However, in such a winding method, variation is likely to occur in the winding positions of the first and second wires 41 and 42, making it difficult to exactly uniformly wind the wires in practice. Actually, like a differential mode filter 10X$_2$ illustrated in FIG. 9, variation occurs in the winding position. Such variation often randomly occurs at manufacturing process and, accordingly, large variation may occur in high-frequency characteristics to be actually obtained.

On the other hand, as described above, variation in the winding position is suppressed in the differential mode filter 10 according to the present embodiment, so that it is possible to stably obtain more enhanced high-frequency characteristics than those obtained from the conventional differential mode filters.

Figure 10:
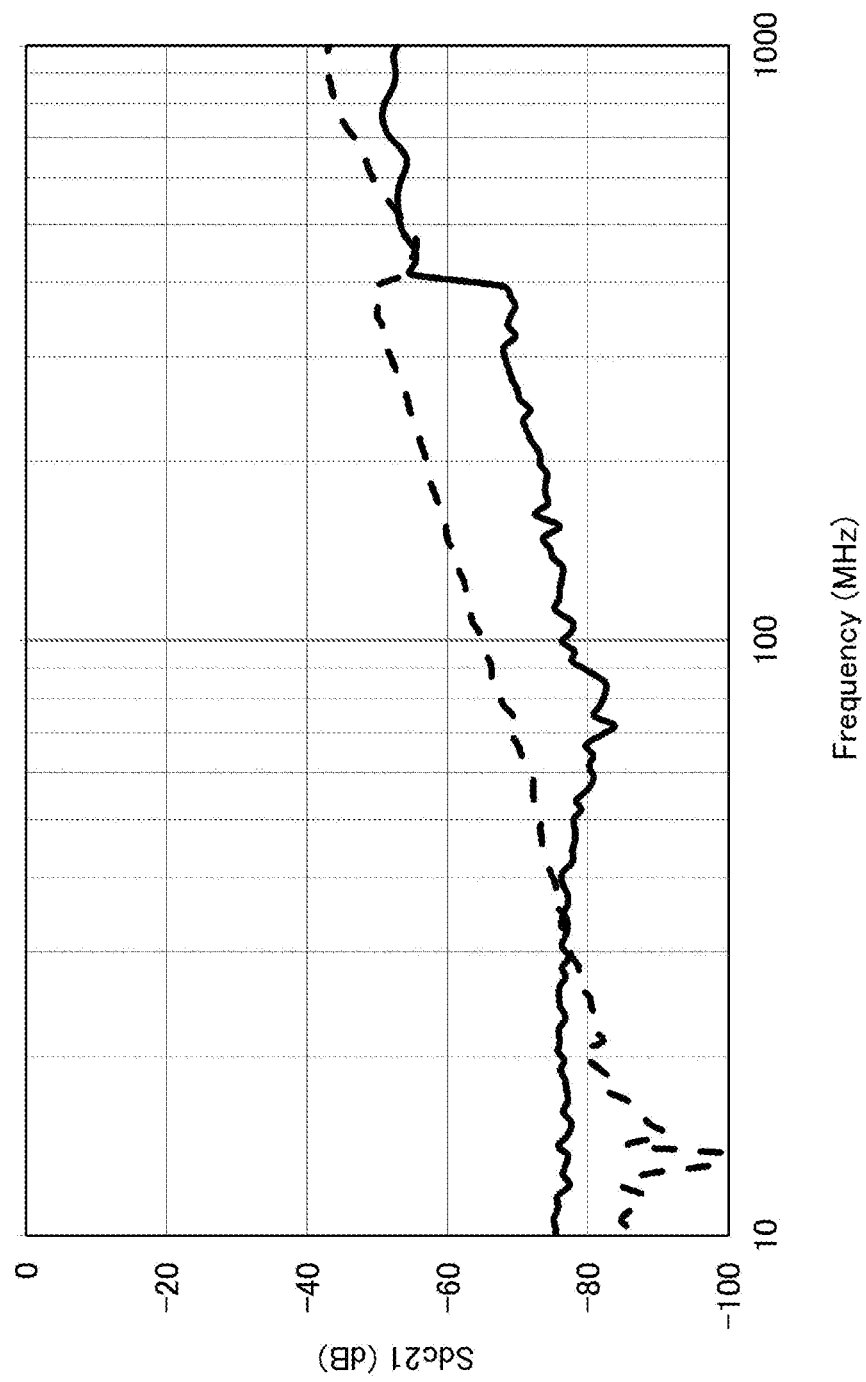
FIG. 10 is a graph illustrating the high-frequency characteristics of the differential mode filter shown in FIG. 5 and those of the differential mode filter shown in FIG. 9.

FIG. 10 is a graph illustrating the high-frequency characteristics of the differential mode filter 10 according to the present embodiment and those of the differential mode filter 10X$_2$ according to the reference example.

The high-frequency characteristics illustrated in FIG. 10 are characteristics called "Sdc21", passing characteristics indicating the rate at which a common mode signal is converted into a differential signal. As illustrated in FIG. 10, in the case of the differential mode filter 10 according to the present embodiment (continuous line), the value of Sdc21 is suppressed particularly in a high-frequency region, so that more enhanced high-frequency characteristics than those in the differential mode filter 10x$_2$ according to the reference example (dashed line) can be obtained.

Figure 11:
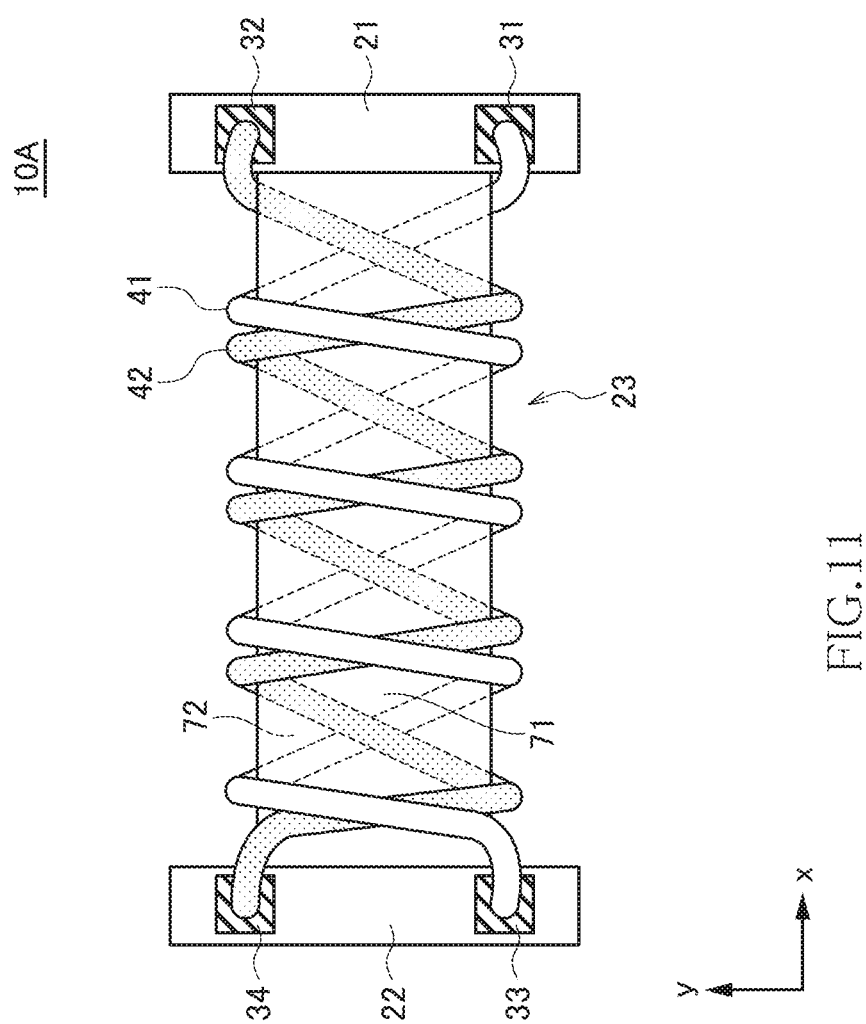
FIG. 11 is a schematic view for explaining a winding layout of a differential mode filter according to a first modification.

FIG. 11 is a schematic view for explaining the winding layout of a differential mode filter 10A according to the first modification.

In the differential mode filter 10A illustrated in FIG. 11, the first and second wires 41 and 42 are partially separated from each other on the first winding surface 71. Specifically, in the vicinity of end portions (corner portions) of the first winding surface 71 in the y-direction, the first and second wires 41 and 42 do not contact each other in the axial direction and partially separated from each other. Even in such a case, variation in the winding position can be suppressed by making the crossing angle θ1 smaller than the crossing angle θ2. Thus, in the present invention, the first and second wires 41 and 42 may be partially separated from each other on the first winding surface 71.

Figure 12:
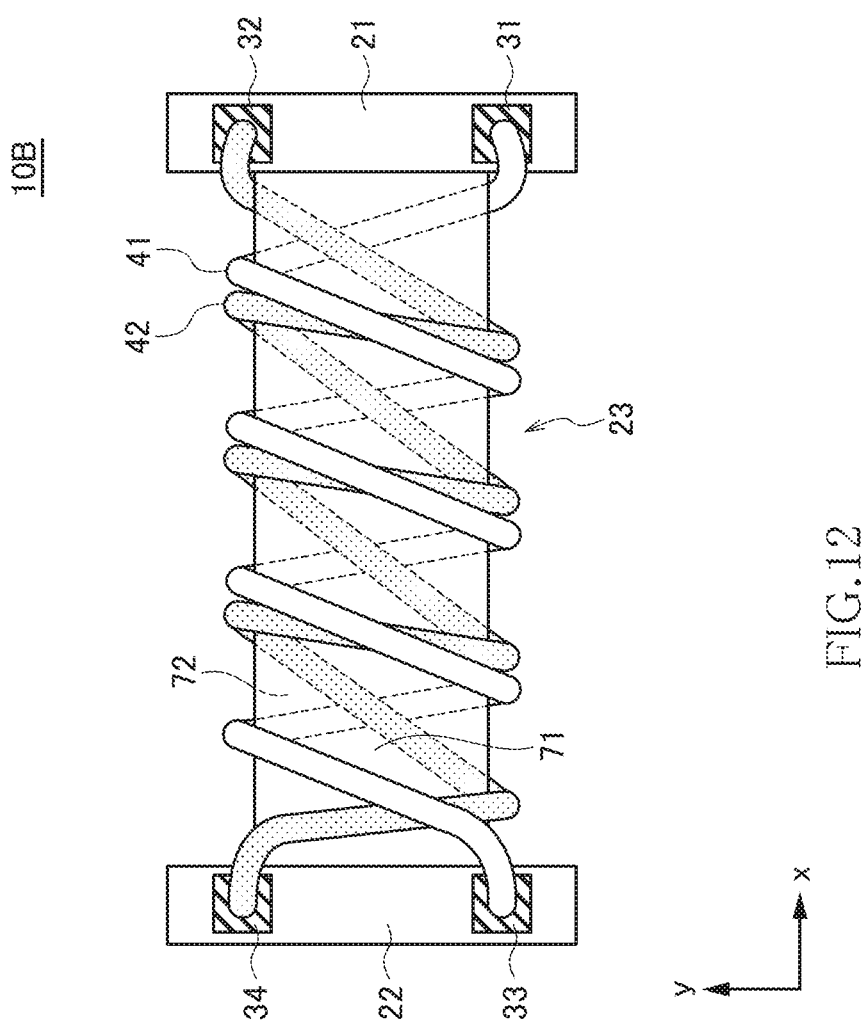
FIG. 12 is a schematic view for explaining a winding layout of a differential mode filter according to a second modification.

FIG. 12 is a schematic view for explaining the winding layout of a differential mode filter 10B according to the second modification.

In the differential mode filter 10B illustrated in FIG. 12, the first and second wires 41 and 42 are inclined in the same direction on the first winding surface 71. Even in such a case, substantially the same effect as that in the above-described differential mode filter 10 can be obtained. Thus, in the present invention, the inclination directions of the first and second wires 41 and 42 on the first winding surface 71 need not be opposite to each other with respect to the y-axis.

While the preferred embodiments of the present invention have been described, the present invention is not limited thereto. Thus, various modifications may be made without departing from the gist of the invention, and all of the modifications thereof are included in the scope of the present invention.

For example, although the differential mode filter 10 according to the above embodiment has a configuration where the four terminal electrodes 31 to 34 are bonded to the core 20, the terminal electrodes 31 to 34 may be directly formed on the core 20 by using a conductive paste or the like.

What is claimed is:

1. A differential mode filter comprising:
   a core including a winding core part;
   a first wire wound around the winding core part in a first winding direction; and
   a second wire wound around the winding core part in a second winding direction opposite to the first winding direction,
   wherein the winding core part includes first and second winding surfaces, and
   wherein a first crossing angle between the first and second wires that cross a plurality of times on the first winding surface is smaller than that a second crossing angle between the first and second wires that cross a plurality of times on the second winding surface, and
   wherein each of the first and second crossing angles is less than 90 degrees.

2. The differential mode filter as claimed in claim 1, wherein the first and second wires contact each other in an axial direction of the winding core part on the first winding surface.

3. The differential mode filter as claimed in claim 1, wherein the winding core part has a substantially quadrangular shape in cross section perpendicular to an axial direction of the winding core part.

4. The differential mode filter as claimed in claim 1, further comprising:
   first and third terminal electrodes connected respectively to one and other ends of the first wire; and
   second and fourth terminal electrodes connected respectively to one and other ends of the second wire,
   wherein the core further includes a first flange part provided at one end of the winding core part in an axial direction and a second flange part provided at other end of the winding core part in the axial direction, and
   wherein the first and second terminal electrodes are provided on the first flange part, and the third and fourth terminal electrodes are provided on the second flange part.

5. The differential mode filter as claimed in claim 1, wherein the first crossing angle is defined by a smallest angle between the first and second wires that cross a plurality of times on the first winding surface, and wherein the second crossing angle is defined by a smallest angle between the first and second wires that cross a plurality of times on the second winding surface.

6. The differential mode filter as claimed in claim 1,
wherein the first winding surface has a first edge extending in an axial direction of the winding core part,
wherein the second winding surface has a second edge extending in the axial direction of the winding core part,
wherein the first crossing angle is an internal angle of a first triangle formed by the first wire, the second wire, and the first edge, and
wherein the second crossing angle is an internal angle of a second triangle formed by the first wire, the second wire, and the second edge.

7. The differential mode filter as claimed in claim 6, wherein the second triangle is greater in area than the first triangle.

8. A differential mode filter comprising:
a core including a winding core part, a first flange part provided at one end of the winding core part in an axial direction, and a second flange part provided at an other end of the winding core part in the axial direction;
a first wire wound around the winding core part in a first winding direction; and
a second wire wound around the winding core part in a second winding direction opposite to the first winding direction,
wherein the winding core part includes a first winding surface on which the first and second wires cross each other and wherein the winding core part further includes a second winding surface opposite to the first winding surface, wherein the first and second wires also cross each other on the second winding surface;
wherein the first winding surface has a first region in which the first and second wires are positioned on the first flange part side and the second flange part side, respectively, a second region in which the first and second wires are positioned on the second flange part side and the first flange part side, respectively, and a third region arranged between the first and second regions;
wherein the third region is arranged between the first and second regions so that the first and second regions do not overlap with each other,
wherein the first and second wires contact each other in at least one of the first and second regions, and
wherein the first and second wires have a higher degree of parallelism on the first winding surface than on the second winding surface.

9. The differential mode filter as claimed in claim 8, wherein the first and second wires contact each other in both the first and second regions.

10. The differential mode filter as claimed in claim 8, wherein the first and second wires contact each other in the axial direction of the winding core part on the first region, and
wherein the first and second wires contact each other in a radial direction of the winding core part on the third region.

11. The differential mode filter as claimed in claim 9,
wherein the first and second wires contact each other in the axial direction of the winding core part on each of the first and second regions, and
wherein the first and second wires contact each other in a radial direction of the winding core part on the third region.

12. A device comprising:
a winding core having a first surface, a second surface, a third surface, a first edge that is a boundary between the first and third surfaces, and a second edge that is a boundary between the second and third surfaces;
a first wire wound around the winding core; and
a second wire wound around the winding core so as to cross the first wire on the first and second surfaces,
wherein the first wire has a first section located on the first surface and a second section located on the second surface,
wherein the second wire has a third section located on the first surface so as to cross the first section of the first wire and a fourth section located on the second surface so as to cross the second section of the first wire, and
wherein a first distance between the first section of the first wire and the third section of the second wire on the first edge is narrower than a second distance between the second section of the first wire and the fourth section of the second wire on the second edge.

13. The device as claimed in claim 12, wherein the first surface is opposite to the second surface.

14. The device as claimed in claim 13, wherein the winding core further has a fourth surface that is opposite to the third surface, a third edge that is a boundary between the first and fourth surfaces, and a fourth edge that is a boundary between the second and fourth surfaces.

15. The device as claimed in claim 14, wherein a third distance between the first section of the first wire and the third section of the second wire on the third edge is narrower than a fourth distance between the second section of the first wire and the fourth section of the second wire on the fourth edge.

16. The device as claimed in claim 15, wherein the first distance is narrower than the fourth distance.

17. The device as claimed in claim 16, wherein the third distance is narrower than the second distance.

18. The device as claimed in claim 17, wherein the first distance is substantially a same as the third distance.

19. The device as claimed in claim 17, wherein the second distance is substantially a same as the fourth distance.

20. The device as claimed in claim 12, a contact length of the first section of the first wire and the third section of the second wire is greater than a contact length of the second section of the first wire and the fourth section of the second wire.

* * * * *